United States Patent
Iida et al.

(10) Patent No.: US 8,802,570 B2
(45) Date of Patent: Aug. 12, 2014

(54) PATTERN FORMING METHOD

(71) Applicant: Canon Kabushiki Kaisha, Tokyo (JP)

(72) Inventors: Kenichi Iida, Kawasaki (JP); Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/682,619

(22) Filed: Nov. 20, 2012

(65) Prior Publication Data

US 2013/0137252 A1 May 30, 2013

(30) Foreign Application Priority Data

Nov. 28, 2011 (JP) .................................. 2011-259272

(51) Int. Cl.
*H01L 21/311* (2006.01)
(52) U.S. Cl.
USPC .......................................... 438/694; 427/277
(58) Field of Classification Search
USPC ........................................... 438/694; 427/277
See application file for complete search history.

(56) References Cited

U.S. PATENT DOCUMENTS

| | | | | |
|---|---|---|---|---|
| 4,530,953 A | * | 7/1985 | Yoshida | 524/311 |
| 5,259,926 A | * | 11/1993 | Kuwabara et al. | 216/54 |
| 8,419,995 B2 | * | 4/2013 | Yoneda et al. | 264/293 |
| 2007/0267764 A1 | * | 11/2007 | Morimoto | 264/1.1 |
| 2008/0167396 A1 | * | 7/2008 | Murao | 522/67 |
| 2010/0078860 A1 | * | 4/2010 | Yoneda et al. | 264/496 |

FOREIGN PATENT DOCUMENTS

| | | |
|---|---|---|
| JP | 2010-103464 A | 5/2010 |
| JP | 2010-262980 A | 11/2010 |

* cited by examiner

*Primary Examiner* — Lex Malsawma
(74) *Attorney, Agent, or Firm* — Canon U.S.A., Inc., IP Division

(57) ABSTRACT

In a pattern forming method, a pattern having at least either a recess or a protrusion of a curable composition is formed of a curable composition by curing the curable composition into a cured film with a mold having a surface provided with at least either a recess or a protrusion, and separating the mold from the curable composition. The method includes (i) forming a gas generation region containing a gas generator agent so that the gas generation region will be disposed in contact with both the mold and the cured film between the mold and the cured film, (ii) generating a gas from the gas generation region, and (iii) separating the mold from the cured film during or after the step of (ii).

16 Claims, 2 Drawing Sheets

PATTERN FORMING METHOD

BACKGROUND OF THE INVENTION

1. Field of the Invention

The present invention relates to pattern forming methods, and, particularly, to a method for forming a pattern by photo-nanoimprinting.

2. Description of the Related Art

A photo-nanoimprinting method is a technique for forming projections and recesses in a resin thin film on a substrate by curing the resin thin film while a mold having a surface provided with projections and recesses is pressed against the resin thin film, and thus transferring the projections and recesses to the thin film. The mold may be referred to as a stamper.

In the photo-nanoimprinting method, the mold and the cured resin thin film adhere to each other, and a high releasing power is required for separating them from each other. However, high releasing power may cause a defect such as a crack in the pattern of the cured film, or cause the substrate having the cured film to rise from the surface of a stage on which the substrate has been placed and result in a reduced precision in alignment. Accordingly, it is desirable to reduce the releasing power.

Japanese Patent Laid-Open No. 2010-262980 teaches that a gas generator agent is added to a curable composition for nanoimprinting lithography.

Japanese Patent Laid-Open No. 2010-103464 discloses an imprinting method using a photo-curable resin that can generate a gas in at least either a heating condition or a pressuring or pressure-reducing condition (paragraph 0118). In this method, a mold is brought into contact with a photo-curable resin in a high pressure atmosphere and, then, irradiating the photo-curable resin with light through a mold to cure the photo-curable resin. Then, the high pressure atmosphere is changed into a reduced pressure atmosphere, so that the gas contained in the cured film of the photo-curable resin is evaporated and accumulated in the boundary between the cured film and the mold. The gas accumulated in the boundary lowers the adhesion between the cured film and the mold.

The gas generator agent described in Japanese Patent Laid-Open No. 2010-262980, which is allowed to generate a gas by light or heat, undesirably generates a gas when the curable composition is cured by light. This can generate bubbles while the curable composition is cured, and result in transfer failure.

In the method described in Japanese Patent Laid-Open No. 2010-103464, a gas is generated within the photo-curable composition by pressure application and pressure reduction. Accordingly, a chamber for performing pressure application and pressure reduction is used, and the process of the method requires a lot of time and effort.

SUMMARY OF THE INVENTION

The present invention provides a pattern forming method that requires little releasing power. In the pattern forming method, a pattern having at least either a recess or a protrusion is formed of a curable composition by curing the curable composition into a cured film in a state where a mold having a surface provided with at least either a recess or a protrusion is substantially in contact with the curable composition, and separating the mold from the curable composition. The method includes: (i) forming a gas generation region containing a gas generator agent so that the gas generation region will be disposed in contact with the mold and the cured film between the mold and the cured film; (ii) generating a gas from the gas generation region; and (iii) separating the mold from the cured film during or after the step of (ii). In this method, the gas is selectively generated from the gas generation region formed between the mold and the curable composition. Accordingly, the mold and the cured film can be separated from each other with a low releasing power.

Further features of the present invention will become apparent from the following description of exemplary embodiments with reference to the attached drawings.

DESCRIPTION OF THE EMBODIMENTS

The present invention will be further described in detail, using the following embodiments. It will be understood that the present invention is not limited to the following embodiments and includes any modification or change that can be made within the scope and spirit of the invention on the basis of the knowledge of those skilled in the art.

The term photo-nanoimprinting method mentioned herein refers to a method for forming a pattern whose minimum line width is 1 nm to 10 mm, such as about 10 nm to 100 μm.

Pattern Forming Method

In the pattern forming method according to the embodiments of the invention, a pattern having at least either protrusions or recesses is formed of a curable composition by curing the curable composition into a cured film in a state where a mold having a surface provided with at least either protrusions or recesses is substantially in contact with the curable composition, and separating the mold from the cured film. The method includes: (i) forming a gas generation region containing a gas generator agent so that the gas generation region will be disposed in contact with both the mold and the cured film between the mold and the cured film; (ii) generating a gas from the gas generation region; and (iii) separating the mold from the cured film during or after the above step (ii). In step (ii) of an embodiment, the gas generation region may be formed so that the curable composition will not generate a gas.

A pattern forming method according to an embodiment of the invention will now be described in detail.

Figure 1A:
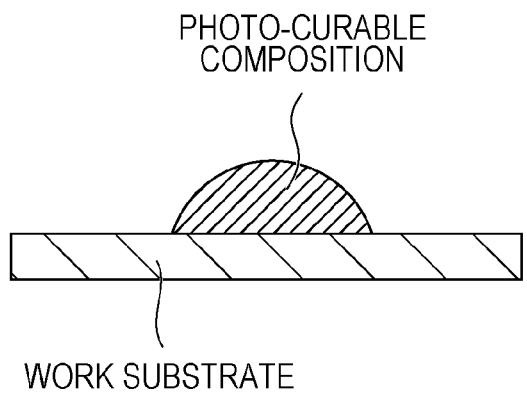
FIGS. 1A to 1H are sectional views illustrating a photo-nanoimprinting method.
Figure 1B:
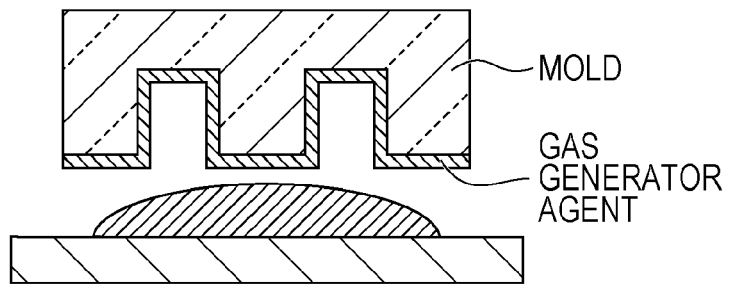
Figure 1C:
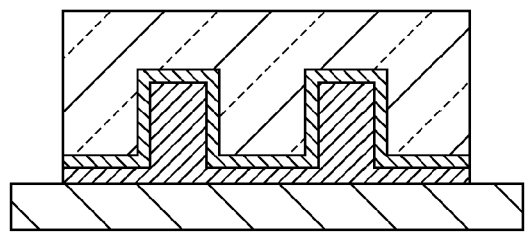
Figure 1D:
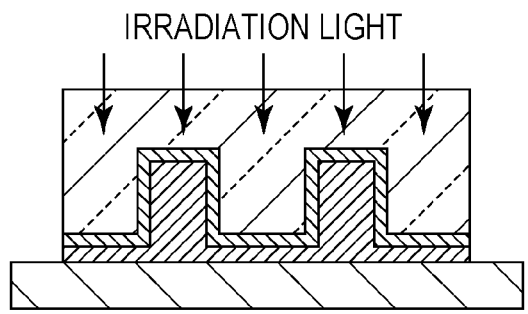
Figure 1E:
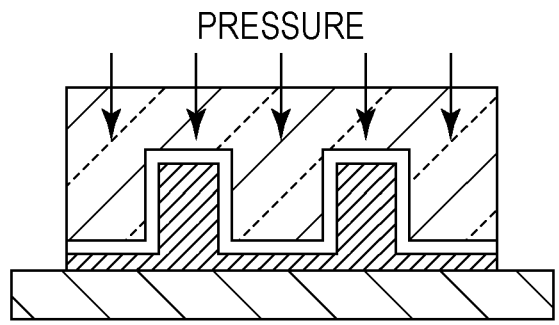
Figure 1F:
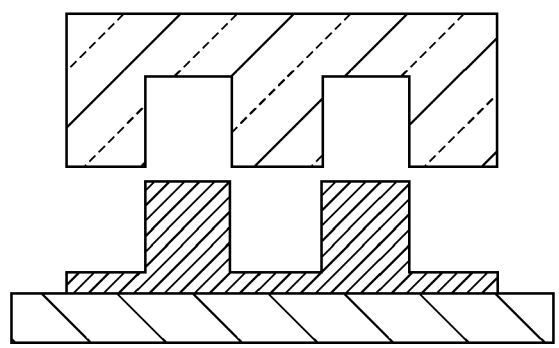

As shown in FIGS. 1A to 1H, the pattern forming method includes the step of forming a shape transfer layer of a curable composition on a work substrate (coating step, FIG. 1A), the step of applying a gas generator agent for forming a gas generation region onto a surface of a mold (mold surface treatment step, FIG. 1B), the step of bringing the mold into contact with the curable composition (shape transfer layer) with the gas generation region therebetween (mold contact step, FIG. 1C), the step of irradiating the shape transfer layer with light through the mold kept substantially in contact with the shape transfer layer (irradiation step, FIG. 1D), the step of applying a pressure to the shape transfer layer with the mold kept substantially in contact (pressure application step, FIG. 1E), and the step of separating the mold from the shape transfer layer (mold releasing step, FIG. 1F).

Through the steps from the coating to the irradiation, shown in FIGS. 1A to 1D, the gas generation region containing a gas generator agent is disposed in contact with the mold and the cured film of the curable composition between the mold and the cured film. Then, a gas is generated from the gas generation region in the pressure application step shown in FIG. 1E. Since the gas generation region is provided apart from the cured film of the curable composition, the method can be performed so that a gas can be generated from the gas generation region without being generated from the curable composition in the pressure application step. Consequently, the mold can be separated at a low releasing power in the mold releasing step.

Thus, the method of the present embodiment can form a pattern with few transfer failures and a low releasing power.

The gas generator agent can be a material that is allowed to generate a gas by receiving a pressure, and hence, the above step (ii) can be performed by applying a pressure to the gas generation region.

Furthermore, the gas generator agent can be a material that is allowed to generate a gas by a chain reaction induced by pressure application.

The gas generation region can be formed on the surface of the mold before bringing the mold into contact with the curable composition.

The pressure application step can be advantageously performed by bringing the mold close to the work substrate rather than by bringing the mold and the work substrate into contact with each other.

The gas generation region can be bound to the surface of the mold with covalent bonds or hydrogen bonds.

Figure 1G:
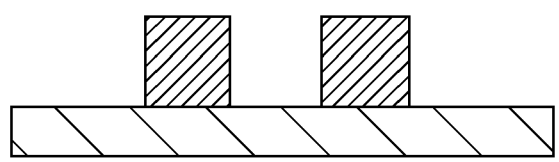

The method can further include removing the residue remaining in the recesses of the shape transfer layer by etching after the mold releasing step, thus exposing the surface of the work substrate in the recesses of the pattern (residue removing step, FIG. 1G).

Steps of the pattern forming method will now be described.

Applying Curable Composition (FIG. 1A)

In the present embodiment, the step of applying the curable composition is performed by coating. The work substrate is coated with the curable composite. The work substrate may be a silicon wafer. Other substrates for semiconductor devices may be used, such as those of aluminum, a titanium-tungsten alloy, an aluminum-silicon alloy, an aluminum-copper-silicon alloy, silicon oxide, and silicon nitride.

The work substrate may have been surface-treated. Surface treatment can enhance the adhesion to the curable composition. The coating may be performed by, for example, an ink jet method, dip coating, air knife coating, curtain coating, a wire barcode method, gravure coating, extrusion coating, spin coating, or a slit scan method. The thickness of the shape transfer layer depends on the use, and is, for example, 0.01 to 100.0 μm.

Mold Surface Treatment (FIG. 1B)

In the mold surface treatment step, the surface of the mold is coated with a pressure-sensitive gas generator agent. Any technique may be applied to coat the mold as long as the surface of the mold can be coated, and this coating is performed by, for example, an ink jet method, dip coating, air knife coating, curtain coating, a wire barcode method, gravure coating, extrusion coating, spin coating, or a slit scan method.

The thickness of the coating of the pressure-sensitive gas generator agent depends on the type of the gas generator agent, and is, for example, 0.001 to 100.0 μm, preferably 0.01 to 10 μm. If the thickness of the coating of the pressure-sensitive gas generator agent is less than 0.001 μm, the coating cannot generate an amount of gas sufficient to reduce the releasing power. In contrast, if the thickness is more than 100 μm, the recesses of the pattern of the mold cannot be filled with the curable composition, and consequently, the pattern of the mold may not be precisely transferred.

The amount of gas generated from the pressure-sensitive gas generator agent depends on the molecular weight of the pressure-sensitive gas generator agent and how much the gas generator agent responds to the pressure applied, and is not particularly limited. For example, if an azide compound is applied as the pressure-sensitive gas generator agent to the surface of the mold, the azide compound will generate nitrogen gas in an amount of twice to 50 times the volume thereof in the pressure application step that will be described later. The nitrogen gas penetrates into the boundary between the curable composition (or its cured film) and the mold to produce such a pressure as can separate the mold from the cured film of the curable composition. The pressure that can separate the mold from the cured film of the curable composition acts as a power for separating the mold from the cured film, thus reducing the releasing power.

The magnitude of the pressure for separating the mold from the cured film is not particularly limited, and is desirably adjusted so that an amount of gas can be generated to the extent that the mold will separate from the cured film.

Mold Contact (FIG. 1C)

For bringing the mold substantially into contact with the curable composition, in the present embodiment, the following mold contact step is performed. The recesses of the fine pattern formed in the surface of the mold are filled with the curable composition.

The mold is made of an optically transparent material. Specifically, the mold may be made of, for example, glass, quartz, PMMA, an optically transparent resin such as polycarbonate, a transparent metal film formed by vapor deposition, a soft film of polydimethylsiloxane or the like, a photocuring film, or a metal film.

The gas generator agent can be a material that does not generate a gas in the mold contact step, but generates a gas in the pressure application step in which a pressure higher than the pressure produced in the mold contact step is applied. Although the pressure produced in the mold contact step is not particularly limited, the pressure is preferably in the range of 0.1 to 20 MPa, and is more preferably as low as possible in this range. If a high pressure is produced in the mold contact step, the lower limit in the range of pressure at which a gas will not be generated from the pressure-sensitive gas generator agent is increased.

The gas generator agent may leach into the shape transfer layer of the curable composition in the mold contact step. In this instance, the thickness of the coating of the gas generator agent can be increased according to the degree of leaching. If the gas generator agent does not leach into the shape transfer layer in the mold contact step, the thickness of the coating of the gas generator agent applied in the mold surface treatment step can be reduced so as to precisely transfer the pattern of the mold having protrusions and recesses.

The mold is kept in contact with the curable composition for a period in the range of typically 1 to 600 seconds, preferably 1 to 300 seconds, more preferably 1 to 180 seconds, and particularly 1 to 120 seconds. If the period of the contact is short, the recesses of the mold may not be sufficiently filled with the curable composition. If the period of the contact is long, the throughput of photo-nanoimprinting is reduced.

The mold contact step can be performed in an atmosphere of air, reduced pressure, or an inert gas. Inert gases that can be used in this step include nitrogen, carbon dioxide, helium, chlorofluorocarbon gases, and mixtures of these gases. The pressure can be set in the range of 0.0001 to 10 atmospheres. In order to prevent oxygen or moisture from affecting the curable composition, the mold contact step is performed in an atmosphere of reduced pressure or an inert gas.

Irradiation (FIG. 1D)

In the present embodiment, the irradiation step is performed by exposing the shape-transfer layer to light with the mold kept substantially in contact with the shape-transfer layer. The curable composition of the shape transfer layer, with which the recesses in the surface of the mold have been filled in the mold contact step, is cured.

The light used for irradiation is selected, without particular limitation, according to the wavelength to which the curable composition is sensitive. For example ultraviolet light having a wavelength of 150 to 400 nm, X-ray radiation, electron-ray radiation, or the like can be appropriately selected. Ultraviolet light is convenience because various compounds sensitive to ultraviolet light are readily available as photopolymerization initiator (B) described later. Light sources that emit ultraviolet light include high-pressure mercury-vapor lamps, ultra-high-pressure mercury-vapor lamps, low-pressure mercury-vapor lamps, Deep-UV lamps, carbon arc lamps, chemical lamps, metal halide lamps, xenon lamps, KrF excimer lasers, ArF excimer lasers, and F2 excimer lasers. In an embodiment, an ultrahigh-pressure mercury-vapor lamp is advantageous. These radiations may be used singly or in combination. The irradiation may be performed over the entire surface of the shape transfer layer, or to a portion of the surface.

If the mold is made of an optically transparent material, the curable composition can be exposed to light through the mold. If the work substrate is transparent, the exposure may be performed through the substrate.

Depending on the combination of the gas generator agent and the wavelength of the irradiation light, a small amount of gas may be generated when the curable composition is cured. It is desirable that the amount of gas be so small as curing failure or the like, which leads to a reduced mechanical strength of the cured film, does not occur in the curable composition. It is also desirable that, if possible, the wavelength of the irradiation light be selected so that the gas generator agent does substantially not generate a gas at the wavelength.

If the shape transfer layer is thermally curable, heat curing may further be performed. The heating atmosphere, heating temperature and other conditions for heat curing are not particularly limited, and, for example, the heat curing may be performed at a temperature of 40 to 200° C. in an inert gas atmosphere or under reduced pressure. For the heating, for example, a hot plate, an oven or a furnace may be used.

Pressure Application Step (FIG. 1E)

In the pressure application step, a higher pressure than the pressure produced in the mold contact step is applied to the gas generator agent coating the mold. By applying a higher pressure than the pressure produced in the mold contact step, the gas generator agent generates a gas. The gas attempts to expand and thus reduce the adhesion between the cured film of the curable composition and the mold. Consequently, the releasing power required in the separation step is reduced.

How a higher pressure than the pressure produced in the mold contact step is applied is not particularly limited. For example, the work substrate and the mold may be brought closer to each other than in the mold contact step. More specifically, the work substrate may be moved close to the mold to apply a pressure to the gas generator agent, or the mold may be moved close to the work substrate to apply a pressure to the gas generator agent. Alternatively, the work substrate may be moved close to the mold while the mold is moved close to the work substrate.

How long the pressure is applied is not particularly limited. From the viewpoint of reducing the process time for photo-nanoimprinting, a higher pressure than the pressure produced in the mold contact step is applied for a time as short as possible.

The upper limit of the pressure is not particularly limited, and the pressure can be such that the shape of the shape transfer layer, or cured film of the curable composition, is maintained. For example, a pressure in the range of 20 to 100 MPa may be advantageously applied.

The number of times of pressure application is not particularly limited. The pressure may be applied by moving either the mold or the work substrate or both of them several times.

Mold Releasing Step (FIG. 1F)

In the mold releasing step, the mold is separated from the shape transfer layer. A pattern reverse to the fine pattern of the mold is obtained in the cured film of the curable composition by the mold releasing step.

How the mold is separated is not particularly limited, and also, the conditions for separation are not particularly limited. For example, the mold may be moved so as to separate from the fixed work substrate, or the work substrate may be moved so as to separate from the fixed mold. Alternatively, the mold and the work substrate may be drawn in the opposite directions so as to separate from each other.

Residue Removing Step (FIG. 1G)

In the residue removing step, the residue remaining in the recesses of the shape transfer layer, which is thin films having smaller thicknesses than the height of the protrusions of the shape transfer layer, is removed by etching so that the surface of the work substrate can be exposed in the recesses.

For the etching, any technique can be applied without particular limitation, and a known technique, such as dry etching, may be performed. For the dry etching, a known dry etching apparatus can be used. The source gas used for the dry etching is appropriately selected according to the elemental composition of the film to be etched. For example, a gas containing oxygen such as $O_2$, CO or $CO_2$, or an inert gas such as He, $N_2$ or Ar can be used. A mixed gas of these gases may be used.

Figure 1H:
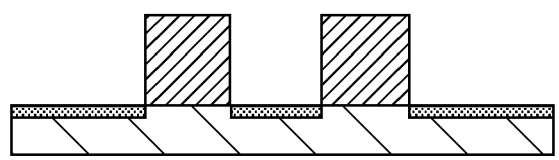

Substrate Working Step (FIG. 1H)

After the surface of the work substrate has been exposed, recesses are formed in the exposed surface by etching or the like in the substrate working step.

The pattern obtained by the substrate working step may be used as an interlayer insulating layer of semiconductor devices, such as LSI, system LSI, DRAM, SDRAM, RDRAM, and D-RDRAM, or as a resist layer or the like used in semiconductor manufacturing processes.

More specifically, in the substrate working step, a circuit configuration is formed in the work substrate by etching or ion implantation, corresponding to the pattern made of the curable composition, as shown in FIG. 1H. Thus, a circuit board such as a semiconductor device is produced. The pattern of the cured film of the curable composition may finally be removed from the substrate, but may be left as a member of a semiconductor device.

In the present embodiment, desirably, the recesses of the pattern of the mold have rectangular sections. Such a pattern has protrusions having rectangular sections. Consequently, a pattern having recesses and protrusions having rectangular sections can be formed by etching. This can be a highly precise wiring pattern.

The resulting substrate may be used as an optical element having a pattern of recesses and protrusions at the surface. Thus, an article including a substrate and a cured film of the curable composition disposed on the substrate is provided.

The gas generator agent and the curable composition used in the pattern forming method will now be described in detail.

Gas Generator Agent

The gas generator agent is a compound that will generate a gas, such as carbon dioxide, nitrogen, oxygen, or hydrogen, by applying a desired pressure thereto.

The gas generator agent can be a compound that is decomposed in a series to explosively generate nitrogen by pressure.

In a gas generator agent that is decomposed by pressure, once the volume of a unit of the gas generator agent is varied by pressure, the change in volume affects the adjacent unit of the gas generator agent, and thus an instant chain reaction propagates to the outside of the units to generate a gas in a short time.

On the other hand, optical decomposition does not cause a chain reaction, and accordingly, light energy is required of each unit of the gas generator agent. This increases the time for generating gas.

Therefore, by using a gas generator agent that will explosively generate a gas by a chain reaction, rather than using a gas generator agent, such as a naphthoquinone azide compound, that will generate a gas by light, the mold can be easily removed in a short time with a reduced releasing power.

The pressure application to the gas generator agent can be easily achieved by pressing the mold with a higher force than in the mold contact step, and the mold can be easily separated from the cured film of the curable composition. Thus, a gas generator agent that is decomposed by pressure is advantageous in the pattern forming method.

For example, azides can be used as a gas generator agent that is decomposed in a series to explosively generate nitrogen by pressure (such a gas is hereinafter referred to as the pressure-sensitive gas generator agent). Once an azide, which is decomposed by applying a pressure, starts decomposing, the azide causes a chain reaction and explosively generates nitrogen gas. Examples of such an azide include, but are not limited to, 3-azidomethyl-3-methyloxetane, terephthalazide, p-tert-butylbenzazide, and polymers having an azide group, such as glycidylazide polymers, that can be produced by ring-opening polymerization of 3-azidomethyl-3-methyloxetane. From the viewpoint of preventing the constituents, such as a polymerizable monomer, of the curable composition from being degraded, the gas generated from the gas generator agent is desirably nitrogen.

The molecules of the pressure-sensitive gas generator agent may form covalent bonds or hydrogen bonds with the surface of the mold.

Curable Composition

The curable composition used in embodiments of the invention contains polymerizable monomer (A) and polymerization initiator (B).

These constituents (A) and (B) will now be described.

Polymerizable Monomer (A)

Polymerizable monomer (A) may be a radically polymerizable monomer or a cationically polymerizable monomer. In the present embodiment, a photo-curable composition that will be cured by receiving light is used. However, other curable composition that will be cured by an impact other than light may be used, such as a thermally curable composition that will be cured by heat.

The radically polymerizable monomer used in the present embodiment can have at least one acryloyl group or methacryloyl group.

Exemplary monofunctional (meth)acrylic compounds having one acryloyl or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth) acrylamide, isobutoxymethyl (meth) acrylamide, N,N-dimethyl (meth) acrylamide, t-octyl (meth) acrylamide, dimethylaminoethyl (meth) acrylate, diethylaminoethyl (meth)acrylate, 7-amino-3,7-dimethyloctyl (meth)acrylate, N,N-diethyl (meth) acrylamide, and N,N-dimethylaminopropyl (meth) acrylamide.

Commercially available monofunctional (meth)acrylic compounds include, but are not limited to, Aronixes M101, M102, M110, M111, M113, M117, M5700, TO-1317, M120, M150 and M156 (each produced by Toagosei); LA, IBXA, 2-MTA, HPA, and Biscoats #150, #155, #158, #190, #192, #193, #220, #2000, #2100 and #2150 (each produced by Osaka Organic Chemical Industry); Light Acrylates BO-A, EC-A, DMP-A, THF-A, HOP-A, HOA-MPE, HOA-MPL, PO-A, P-200A, NP-4EA and NP-8EA, and epoxy ester M-600A (each produced by Kyoeisha); KAYARADs TC110S, R-564 and R-128H (each produced by Nippon Kayaku); NK esters AMP-10G and AMP-20G (each produced by Shin-Nakamura Chemical); FA-511A, 512A and 513A (each produced by Hitachi Chemical); PHE, CEA, PHE-2, PHE-4, BR-31, BR-31M and BR-32 (each produced by Dai-ichi Kogyo Seiyaku); VP (produced by BASF); and ACMO, DMAA and DMAPAA (each produced by Kohjin).

Exemplary (meth)acrylic compounds having two or more acryloyl or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, poly propylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)

propane, PO-modified 2,2-bis(4-((meth)acryloxy)phenyl)propane, and EO,PO-modified 2,2-bis(4-((meth)acryloxy)phenyl)propane.

Commercially available polyfunctional (meth)acrylic compounds include, but are not limited to, Yupimers UV SA1002 and Yupimer UV SA2007 (each produced by Mitsubishi Chemical); Biscoats #195, #230, #215, #260, #335HP, #295, #300, #360, #700, GPT and 3PA (each produced by Osaka Organic Chemical Industry); Light Acrylates 4EG-A, 9EG-A, NP-A, DCP-A, BP-4EA, BP-4PA, TMP-A, PE-3A, PE-4A and DPE-6A (each produce by Kyoeisha); KAYARAD PET-30, TMPTA, R-604, DPHA, DPCA-20, -30, -60 and -120, HX-620, D-310, and D-330 (each produced by Nippon Kayaku); Aronixes M208, M210, M215, M220, M240, M305, M309, M310, M315, M325 and M400 (each produced by Toagosei); and Ripoxy VR-77, Ripoxy VR-60 and Ripoxy VR-90 (each produced by Showa High polymer).

These radically polymerizable monomers may be used singly or in combination. The term (meth)acrylate refers to an acrylate and/or a methacrylate; the (meth)acryloyl group refers to an acryloyl group and/or a methacryloyl group; EO represents ethylene oxide; and an EO-modified compound is a compound having a block of ethylene oxide. PO represents propylene oxide, and a PO-modified compound is a compound having a block of propylene oxide.

Polymerizable Monomer (A)-Cationically Polymerizable Components

The cationically polymerizable monomer used as polymerizable monomer (A) can be a compound having at least one vinyl ether group, epoxy group or oxetanyl group.

Compounds having one vinyl ether group include, but are not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Compounds having two or more vinyl ether groups include, but are not limited to, divinyl ethers, such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, and bisphenol F alkylene oxide divinyl ether; and polyfunctional vinyl ethers, such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, ethylene oxide-added trimethylolpropane trivinyl ether, propylene oxide-added trimethylolpropane trivinyl ether, ethylene oxide-added ditrimethylolpropane tetravinyl ether, propylene oxide-added ditrimethylolpropane tetravinyl ether, ethylene oxide-added pentaerythritol tetravinyl ether, propylene oxide-added pentaerythritol tetravinyl ether, ethylene oxide-added dipentaerythritol hexavinyl ether, and propylene oxide-added dipentaerythritol hexavinyl ether.

Compounds having one epoxy group include, but are not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxide decane, epichlorohydrin, 1,2-epoxy decane, styrene oxide, cyclohexene oxide, 3-methacryloyloxymethylcyclohexene oxide, 3-acryloyloxymethylcyclohexene oxide, 3-vinylcyclohexene oxide.

Compounds having two or more epoxy groups include, but are not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl)adipate, vinyl cyclohexene oxide, 4-vinyl epoxy cyclohexane, bis(3,4-epoxy-6-methylcyclohexylmethyl)adipate, 3,4-epoxy-6-methyl cyclohexyl-3',4'-epoxy-6'-methylcyclohexane carboxylate, methylenebis(3,4-epoxycyclohexane), dicyclopentadiene diepoxide, ethylene glycol di(3,4-epoxycyclohexylmethyl)ether, ethylenebis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether, 1,1,3-tetradecadiene oxide, limonene dioxide, 1,2,7,8-diepoxyoctane, and 1,2,5,6-diepoxycyclooctane.

Compound having one oxetanyl group include, but are not limited to, 3-ethyl-3-hydroxymethyloxetane, 3-(meth) allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl (3-ethyl-3-oxetanylmethyl)ether, isobornyl(3-ethyl-3-oxetanylmethyl)ether, 2-ethylhexyl(3-ethyl-3-oxetanylmethyl)ether, ethyldiethylene glycol (3-ethyl-3-oxetanylmethyl)ether, dicyclopentadiene(3-ethyl-3-oxetanyl methyl)ether, dicyclopentenyloxyethyl(3-ethyl-3-oxetanylmethyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, and bornyl(3-ethyl-3-oxetanyl methyl)ether.

Compounds having two or more oxetanyl groups includes, but are not limited to, polyfunctional oxetane compounds, such as 3,7-bis(3-oxetanyl)-5-oxa-nonane, 3,3'-(1,3-(2-methylenyl)propanediyl bis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3- ethyl-3-oxetanylmethyl)ether, tricyclodecane diyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl)ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, and EO-modified bisphenol F (3-ethyl-3-oxetanylmethyl)ether.

These cationically polymerizable monomers may be used singly or in combination. In the above description, EO represents ethylene oxide, and an EO-modified compound is a compound having a block of ethylene oxide. PO represents propylene oxide, and a PO-modified compound is a compound having a block of propylene oxide. Also, the term "hydrogenated" means adding a hydrogen atom to a C=C double bond of, for example, a benzene ring.

Polymerization Initiator (B)

Polymerization initiator (B) is a radical generator that is allowed to generate radicals by light (radiations, such as infrared rays, visible light rays, ultraviolet rays, far ultraviolet rays, X rays, and electron beams and other charged particle beams) if polymerizable monomer (A) is a radically polymerizable monomer, or is allowed to generate an acid by light if polymerizable monomer (A) is a cationically polymerizable monomer.

Exemplary compounds used as a radical generator include, but are not limited to, substituted or unsubstituted 2,4,5-triarylimidazole dimers, such as 2-(o-chlorophenyl)-4,5-diphenylimidazole dimers, 2-(o-chlorophenyl)-4,5-di(methoxyphenyl)imidazole dimer, 2-(o-fluorophenyl)-4,5-diphenylimidazole dimers, 2-(o- or p-methoxyphenyl)-4,5-diphenylimidazole dimers; benzophenone derivatives, such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivative, such as 2-benzyl-2-dimethylamino-1-(4-morpholinophenyl)-butanone-1,2-methyl-1-[4-(methylthio)phenyl]-2-morpholinopropanone-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin derivatives, such as benzoin, methyl benzoin, ethyl benzoin, and propyl benzoin; benzyl derivatives, such as benzyl dimethyl ketal; acridine derivatives, such as 9-phenyl acridine and 1,7-bis(9,9'-acridinyl)heptane; N-phenylglycine derivatives such as N-phenylglycine; acetophenone derivatives, such as acetophenone, 3-methylacetophenone, acetophenone benzyl ketal, 1-hydroxycyclohexylphenyl ketone, and 2,2-dimethoxy-2-phenylacetophenone; thioxanthone derivatives, such as thioxanthone, diethylthioxanthone, 2-isopropylthioxanthone, and 2-chlorothioxanthone; and xanthone, fluorenone, benzaldehyde, fluorene, anthraquinone, triphenylamine, carbazole, 1-(4-isopropylphenyl)-2-hydroxy-2-methylpropane-1-one, 2-hydroxy-2-methyl-1-phenylpropane-1-one, 2,4,6-trimethylbenzoyl-diphenylphosphine oxide, and bis-(2,6-dimethoxy benzoyl)-2,4,4-trimethylpentylphosphine oxide. These compounds may be used singly or in combination.

Commercially available compounds that can be used as radical generators include, but are not limited to, Irgacures 184, 369, 651, 500, 819, 907, 784 and 2959, CGI-1700, -1750 and -1850, CG24-61, and Darocurs 1116 and 1173 (each produced by Ciba Japan); Lucirin TPO, LR8893, and LR8970 (each produced by BASF); and Ubecryl P36 (produced by UCB).

Exemplary compounds used as a polymerization initiator that is allowed to generate an acid by light include, but are not limited to, onium salts, sulfone compounds, sulfonic acid esters, sulfone imide compounds, and diazomethane compounds. In the present embodiment, an onium salt can be advantageously used.

Onium salts include, but are not limited to, iodonium salts, sulfonium salts, phosphonium salts, diazonium salts, ammonium salts, and pyridinium salts. Exemplary onium salts include, but are not limited to, bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl)sulfonium 2-trifluoromethylbenzenesulfonate, diphenyl(4-t-butylphenyl)sulfonium pyrenesulfonate, diphenyl(4-t-butylphenyl)sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t-butylphenyl)sulfonium 10-camphorsulfonate, diphenyl(4-t-butylphenyl)sulfonium n-octanesulfonate, tris(4-methoxyphenyl)sulfonium perfluoro-n-butanesulfonate, tris(4-methoxyphenyl)sulfonium trifluoromethanesulfonate, tris(4-methoxyphenyl)sulfonium 2-trifluoromethylbenzenesulfonate, tris(4-methoxyphenyl)sulfonium pyrenesulfonate, tris(4-methoxyphenyl)sulfonium n-dodecylbenzenesulfonate, tris(4-methoxyphenyl)sulfonium p-toluenesulfonate, tris(4-methoxyphenyl)

sulfonium benzenesulfonate, tris(4-methoxyphenyl) sulfonium 10-camphorsulfonate, and tris(4-methoxyphenyl) sulfonium n-octanesulfonate.

Sulfone compounds include, but are not limited to, β-ketosulfone, β-sulfonylsulfone, and their α-diazotized compounds. Examples of such a sulfone compound include, but are not limited to, phenacylphenylsulfone, mesitylphenacylsulfone, bis(phenylsulfonyl)methane, and 4-trisphenacylsulfone.

Sulfonic acid esters include, but are not limited to, alkyl sulfonates, haloalkyl sulfonates, aryl sulfonate, and iminosulfonates. Examples of such a sulfonic acid ester include, but are not limited to, α-methylolbenzoin perfluoro-n-butanesulfonate, α-methylolbenzoin trifluoromethanesulfonate, and α-methylolbenzoin 2-trifluoromethylbenzenesulfonate.

Examples of sulfone imide compounds include, but are not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxylmide, N-(trifluoromethylsulfonyloxy)-7-oxabicyclo[2.2.1]hept-5-ene-2,3-dicarboxylmide, N-trifluoromethylsulfonyloxy)bicyclo[2.2.1]heptane-5,6-oxy-2,3-dicarboxylmide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboxylmide, N-(10-camphorsulfonyloxy)-7-oxabicyclo[2.2.1]hept-5-ene-2,3-dicarboxylmide, N-(10-camphorsulfonyloxy)bicyclo[2.2.1]heptane-5,6-oxy-2,3-dicarboxylmide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenyl maleimide, N-(4-methylphenylsulfonyloxy)bicyclo[2.2.1]hept-5-ene-2,3-dicarboxylmide, N-(4-methylphenylsulfonyloxy)-7-oxabicyclo[2.2.1]hept-5-ene-2,3-dicarboxylmide, N-(4-methylphenylsulfonyloxy)bicyclo[2.2.1]heptane-5,6-oxy-2,3-dicarboxylmide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboxy imide, N-(2-trifluoromethylphenylsulfonyloxy)-7-oxabicyclo[2.2.1]hept-5-ene-2,3-dicarboxy imide, N-(2-trifluoromethylphenylsulfonyloxy)bicyclo[2.2.1]heptane-5,6-oxy-2,3-dicarboxylmide, N-(2-trifluoromethylphenylsulfonyloxy)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxy)bicyclo[2.2.1]hept-5-ene-2,3-dicarboxylmide, N-(4-fluorophenylsulfonyloxy)-7-oxabicyclo[2.2.1]hept-5-ene-2,3-dicarboxylmide, N-(4-fluorophenylsulfonyloxy)bicyclo[2.2.1]heptane-5,6-oxy-2,3-dicarboxylmide, and N-(4-fluorophenylsulfonyloxy)naphthylimide.

Examples of diazomethane compounds include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyl diazomethane, cyclohexylsulfonyl 1,1-dimethylethylsulfonyl diazomethane, and bis(1,1-dimethylethylsulfonyl)diazomethane.

Polymerization initiators that are allowed to generate an acid by light may be used singly or in combination.

The proportion of the polymerization initiator (B) to the total weight of the curable composition is 0.01% to 10% by weight, and preferably 0.1% to 7% by weight. If the polymerization initiator (B) content is less than 0.01% by weight, the curing rate is reduced, and the reaction efficiency is reduced accordingly. In contrast, if it is more than 10% by weight, the mechanical strength of the cured film of the curable composition may be reduced.

Other Additives

The curable composition of an embodiment of the invention may contain a sensitizer, an antioxidant, a solvent, a polymer component, and other additives to the extent that does not affect the desired releasing power, in addition to the above-described polymerizable monomer (A) and polymerization initiator (B).

The sensitizer may be added for promoting a polymerization reaction or increasing the conversion rate in the reaction. The sensitizer may be a hydrogen donor or a sensitizing dye.

The hydrogen donor is a compound that can react with an initiator radical generated from polymerization initiator (B) or a chain end radical to produce a more reactive radical. The hydrogen donor can be added when polymerization initiator (B) can generate a photoradical.

Examples of the hydrogen donor include, but are not limited to, amines, such as N-butylamine, di-n-butylamine, tri-n-butylphosphine, allylthiourea, s-benzylisothiuronium-p-toluene sulfinate, triethylamine, diethylaminoethyl methacrylate, triethylenetetramine, 4,4'-bis(dialkylamino)benzophenone, ethyl N,N-dimethylaminobenzoate, isoamyl N,N-dimethylaminobenzoate, pentyl 4-(dimethylamino)benzoate, triethanolamine, and N-phenylglycine; mercapto compounds, such as 2-mercapto-N-phenylbenzoimidazole and mercaptopropionic acid esters.

A sensitizing dye is a compound that is excited by absorbing light having a specific wavelength and acts on polymerization initiator (B). The phrase "acts on" implies that, for example, energy or electrons transfer from the excited sensitizing dye to polymerization initiator (B).

Examples of the sensitizing dye include, but are not limited to, anthracene derivatives, anthraquinone derivatives, pyrene derivatives, perylene derivatives, carbazole derivatives, benzophenone derivatives, thioxanthone derivatives, xanthone derivatives, thioxanthone derivatives, coumarin derivatives, phenothiazine derivatives, camphorquinone derivatives, acridine dyes, thiopyrylium salt dyes, merocyanine dyes, quinoline dyes, styryl quinoline dyes, ketocoumarin dyes, thioxanthene dyes, xanthene dyes, oxonol dyes, cyanine dyes, rhodamine dyes, and pyrylium salt dyes.

Sensitizers may be used singly or in combination.

The proportion of the sensitizer to the total weight of the curable composition is preferably 0 to 20% by weight, more preferably 0.1% to 5.0% by weight, and still more preferably 0.2% to 2.0% by weight. By adding a sensitizer in a proportion of 0.1% by weight, the sensitizer can function effectively. By controlling the proportion of the sensitizer to 5.0% by weight or less, the polymerizable monomer can be cured into a material having a sufficiently large molecular weight. Also, such an amount of sensitizer is unlikely to fail to dissolve, and the degradation of the storage stability can be suppressed.

Temperature at which Curable Composition is Prepared

The constituents of the curable composition can be mixed and dissolved at a temperature in the range of 0 to 100° C.

Viscosity of Curable Composition

The curable composition before being dissolved in a solvent can have a viscosity of 1 to 100 cP at 23° C. The viscosity of the curable composition is more preferably 5 to 50 cP, and still more preferably 6 to 20 cP. If the curable composition has a viscosity higher than 100cP, it is likely to take a long time to fill the recesses of the fine pattern of the mold with the curable composition in the mold contact step, or filling failure can occur and cause a defect in the pattern. If the viscosity is less than 1 cP, the curable composition may not be evenly applied over the substrate in the coating step, or may flow from the end of the mold when coming into contact with the mold.

Surface Tension of Curable Composition

The curable composition before being dissolved in a solvent can have a surface tension of 5 to 70 mN/m at 23° C. The surface tension of the curable composition is more preferably 7 to 35 mN/m, and still more preferably 10 to 32 mN/m.

If the curable composition has a surface tension less than 5 mN/m, it is likely to take a long time to fill the recesses of the mold with the curable composition. In contrast if the surface tension is higher than 70 mN/m, the smoothness of the coating of the curable composition is reduced.

Particulate Matter Contaminating Curable Composition

It is desirable that the curable composition be filtered through a filter with a pore size of, for example, 0.001 to 5.0 μm so as to prevent particulate matter contaminating the curable composition from causing a defect in the pattern of protrusions and recesses of the cured film of the curable composition. The filtration may be performed in a plurality of steps or repeated several times. The filtrate may be filtered again. The filter used for the filtration may be made of, but not limited to, polyethylene, polypropylene, fluororesin, or nylon.

Metallic Impurities Contaminating Curable Composition

In the manufacturing process of semiconductor integrated circuits, it is desirable that the contamination of the curable composition with metallic impurities be minimized from the viewpoint of preventing interference with the operation of the semiconductor product. Accordingly, the concentration of metallic impurities in the curable composition is desirably 10 ppm or less, and more desirably 100 ppb or less.

More specific embodiments will be described below.

First Embodiment

A silicon wafer is used as the work substrate. As shown in FIG. 1A, a photo-curable composition is applied to the surface of the work substrate. The photo-curable composition contains 100 parts by weight of 1,6-hexanediol diacrylate as a polymerizable monomer, and 3 parts by weight of 2-(o-chlorophenyl)-4,5-diphenylimidazole dimer as a polymerization initiator.

A mold of quartz glass whose surface is provided with a pattern having protrusions and recesses is prepared, and 3-azidomethyl-3-methyl oxetane is applied to the surface of the mold to form a gas generation region, as shown in FIG. 1B.

Subsequently, the mold and the curable composition are brought substantially into contact with each other by bringing the mold close to the substrate, as shown in FIG. 1C.

With the mold and the curable composition substantially in contact with each other, the curable composition is cured by being irradiated with light having a wavelength of 313 nm, as shown in FIG. 1D.

Then, in the step shown in FIG. 1E, a pressure is applied between the mold and the substrate by further bringing the mold closer to the substrate, thereby generating a gas from the gas generator agent in the gas generation region. The gas generated from the gas generation region reduces the adhesion between the mold and the cured film of the photo-curable composition. Thus, a pattern having protrusions and recesses can be obtained in the substrate, shown in FIG. 1F, with a lower releasing power in the mold releasing step. Consequently, it is suppressed that defects such as a crack are caused in the pattern of the cured film by mold releasing, and that the precision in alignment is degraded by the substrate having the cured film rising from the surface of a stage on which the substrate has been placed. The gas generation region is formed so that the gas generation region will generate a gas while the curable composition will not generate gas.

The resulting work substrate having the pattern is dry-etched to remove the residue remaining in the recesses of the cured film of the photo-curable composition. Thus, the surface of the work substrate is exposed in the recesses, as shown in FIG. 1G.

The exposed surface of the work substrate is doped with, for example, boron by ion implantation, and thus, a semiconductor substrate on which a circuit pattern has been formed is produced.

Second Embodiment

Unlike the first embodiment, 3-azidomethyl-3-methyl oxetane that will form a gas generation region is applied to the coating of a photo-curable composition on the work substrate, but is not applied to the surface of the mold having a pattern provided with protrusions and recesses.

The liquid applied so as to cover the curable composition on the work substrate is brought into contact with the mold, so that the gas generation region containing the gas generator agent is formed in contact with both the mold and the photo-curable composition between the mold and the photo-curable composition.

Irradiation for curing is performed with this arrangement maintained, and thus the gas generation region is disposed in contact with both the mold and the cured film of the curable composition between the mold and the cured film.

The subsequent operations can be performed in the same manner as in the first embodiment.

Thus, in the pattern forming method according to the embodiments of the present invention, the releasing power for separating the mold can be low.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-259272 filed Nov. 28, 2011, which is hereby incorporated by reference herein in its entirety.

What is claimed is:

1. A pattern forming method for forming a pattern having at least one of a recess and a protrusion of a curable composition by curing the curable composition disposed on a work substrate into a cured film in a state where a mold having a surface provided with at least one of a recess and a protrusion is substantially in contact with the curable composition, and separating the mold from the cured film, the method comprising:

(i) forming a gas generation region containing a gas generator agent so that the gas generation region will be disposed in contact with both the mold and the cured film between the mold and the cured film;

(ii) generating a gas from the gas generation region; and (iii) separating the mold from the cured film during or after the step of (ii), wherein the gas generation region is formed so that the curable composition will not generate a gas in the step of (ii).

2. The pattern forming method according to claim 1, wherein the curable composition is a photo-curable composition that will be cured by being exposed to light.

3. The pattern forming method according to claim 2, further comprising:
applying the photo-curable composition onto the work substrate;
bringing the photo-curable composition substantially into contact with the mold; and
curing the photo-curable composition by irradiating with light the photo-curable composition substantially in contact with the mold,
wherein the gas generation region has been formed on the surface of the mold before bringing the photo-curable composition substantially into contact with the mold.

4. The pattern forming method according to claim 3, wherein the gas generation region is bound to the surface of the mold with covalent bonds or hydrogen bonds between the gas generator agent and the surface of the mold.

5. The pattern forming method according to claim 1, wherein the gas generator agent is a compound that will generate a gas by receiving a pressure, and the step of (ii) is performed by applying a pressure to the gas generation region.

6. The pattern forming method according to claim 5, wherein the gas generator agent generates a gas through a chain reaction caused by receiving a pressure.

7. The pattern forming method according to claim 5 wherein the applying of a pressure is performed by bringing the work substrate and the mold close to each other.

8. A method for manufacturing a circuit board, the method comprising:
performing etching or ion implantation of the work substrate, corresponding to the pattern formed by the method as set forth in claim 1, thereby forming a circuit configuration in the work substrate.

9. A pattern forming method for forming a pattern having at least one of a recess and a protrusion of a curable composition by curing the curable composition disposed on a work substrate into a cured film in a state where a mold having a surface provided with at least one of a recess and a protrusion is substantially in contact with the curable composition, and separating the mold from the cured film, the method comprising:
(i) forming a gas generation region containing a gas generator agent so that the gas generation region will be disposed in contact with both the mold and the cured film between the mold and the cured film;
(ii) generating a gas from the gas generation region; and
(iii) separating the mold from the cured film during or after the step of (ii),
wherein the gas generator agent is a compound that will generate a gas by receiving a pressure, and the step of (ii) is performed by applying a pressure to the gas generation region.

10. The pattern forming method according to claim 9, wherein the gas generation region is formed so that the curable composition will not generate a gas in the step of (ii).

11. The pattern forming method according to claim 9, wherein the curable composition is a photo-curable composition that will be cured by being exposed to light.

12. The pattern forming method according to claim 11, further comprising:
applying the photo-curable composition onto the work substrate;
bringing the photo-curable composition substantially into contact with the mold; and
curing the photo-curable composition by irradiating with light the photo-curable composition substantially in contact with the mold,
wherein the gas generation region has been formed on the surface of the mold before bringing the photo-curable composition substantially into contact with the mold.

13. The pattern forming method according to claim 12, wherein the gas generation region is bound to the surface of the mold with covalent bonds or hydrogen bonds between the gas generator agent and the surface of the mold.

14. The pattern forming method according to claim 9, wherein the gas generator agent generates a gas through a chain reaction caused by receiving a pressure.

15. The pattern forming method according to claim 9, wherein the applying of a pressure is performed by bringing the work substrate and the mold close to each other.

16. A method for manufacturing a circuit board, the method comprising:
performing etching or ion implantation of the work substrate, corresponding to the pattern formed by the method as set forth in claim 9, thereby forming a circuit configuration in the work substrate.

* * * * *